United States Patent
Fagerness et al.

(10) Patent No.: US 7,523,367 B2
(45) Date of Patent: Apr. 21, 2009

(54) METHOD AND APPARATUS TO VERIFY NON-DETERMINISTIC RESULTS IN AN EFFICIENT RANDOM MANNER

(75) Inventors: Gerald G. Fagerness, Winona, MN (US); Terry J. Opie, Rochester, MN (US); Paul E. Schardt, Rochester, MN (US); David E. Wood, Dennison, MN (US)

(73) Assignee: International Business Machines Corporation, Armonk, NY (US)

( * ) Notice: Subject to any disclaimer, the term of this patent is extended or adjusted under 35 U.S.C. 154(b) by 398 days.

(21) Appl. No.: 11/171,783

(22) Filed: Jun. 30, 2005

(65) Prior Publication Data

US 2007/0022337 A1      Jan. 25, 2007

(51) Int. Cl.
*G11C 29/00*        (2006.01)
(52) U.S. Cl. .................... 714/719; 714/739; 714/742

(58) Field of Classification Search .................. 714/719, 714/739, 742
See application file for complete search history.

(56) References Cited

U.S. PATENT DOCUMENTS

| | | | | |
|---|---|---|---|---|
| 4,370,746 | A * | 1/1983 | Jones et al. | 714/743 |
| 5,127,010 | A * | 6/1992 | Satoh | 714/739 |
| 5,666,368 | A * | 9/1997 | Proulx | 714/738 |
| 5,668,819 | A * | 9/1997 | Fukushima | 714/736 |
| 6,978,216 | B2 * | 12/2005 | Sweet | 702/118 |

* cited by examiner

*Primary Examiner*—Cynthia Britt
*Assistant Examiner*—Steve Nguyen
(74) *Attorney, Agent, or Firm*—Patterson & Sheridan, LLP (57) ABSTRACT

The present invention is directed to a system, method and article of manufacture for testing and design verification of hardware devices by providing for random accesses to the registers of a device under test. Such random accesses may more closely resemble actual accesses to the registers of a device during normal operation, thus providing a more thorough test.

6 Claims, 7 Drawing Sheets

METHOD AND APPARATUS TO VERIFY NON-DETERMINISTIC RESULTS IN AN EFFICIENT RANDOM MANNER

BACKGROUND OF THE INVENTION

1. Field of the Invention

The present invention generally relates to a testing and design verification of computer hardware devices and more specifically to the testing of the integrity of the contents of registers during the course of operation of a device.

2. Description of the Related Art

Hardware devices such as Central Processing Units (CPU) contain special high speed memory areas referred to as registers. Registers can be used for manipulating data and for storing important information that determines the functionality of the device based on the specifications of the hardware environment in which it is placed. For example, certain bits in a given register may set one among many connection speeds between the hardware device and another device. Such registers are called configuration registers. During the course of normal operation of the hardware device, configuration registers and other registers may be accessed several times and by many different devices.

As an example, in a gaming system, a graphical processing unit (GPU) and/or direct memory access (DMA) unit may access registers of a CPU, and vice-versa. It is therefore essential to ensure that values in these registers are not changed inadvertently during these accesses. Further, the values in all registers must maintain their integrity during access to a particular register itself, accesses to any other registers and during non-register traffic.

Figure 1:
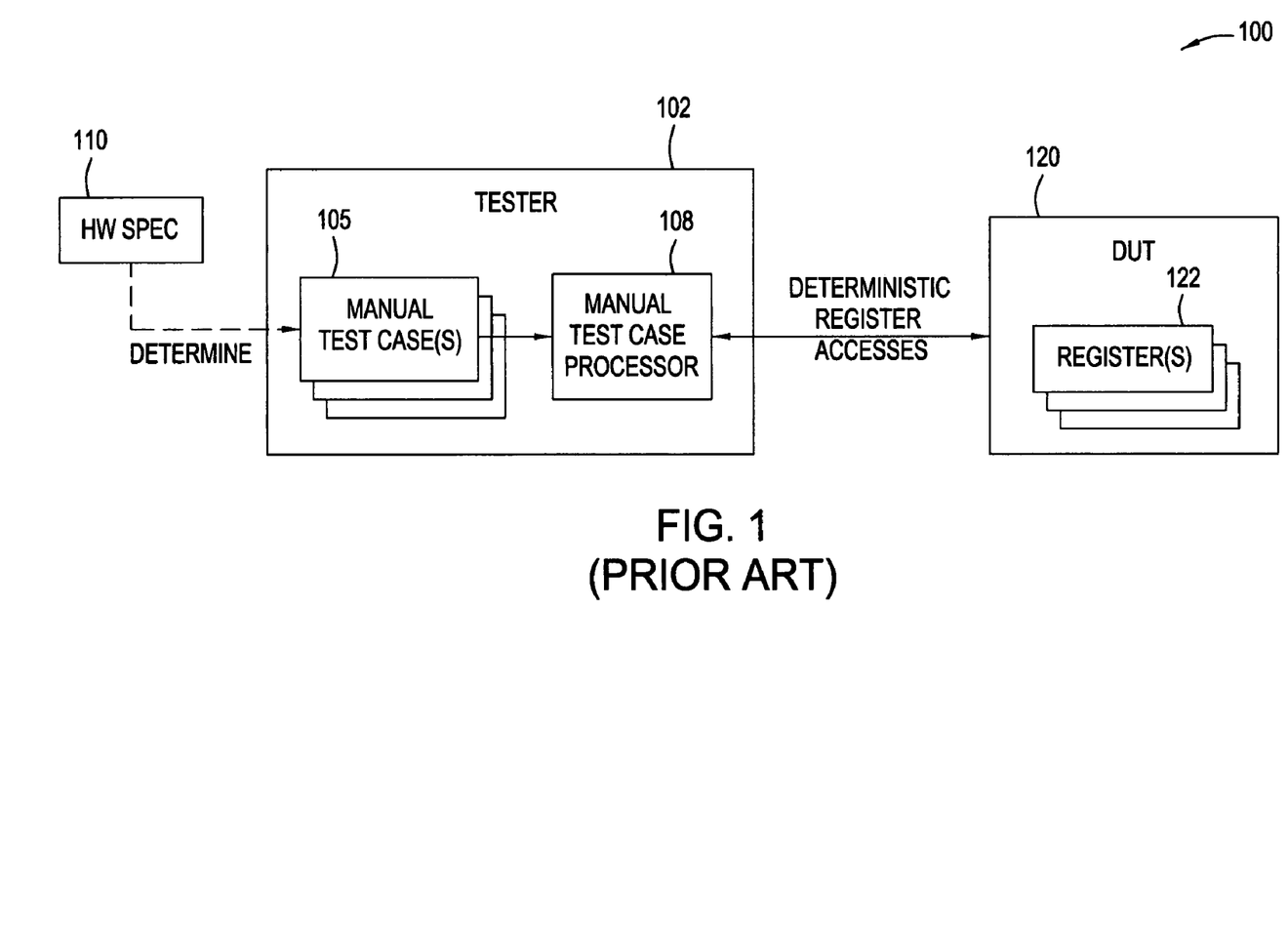
FIG. 1 illustrates an exemplary test system, in accordance with the prior art.

The goal of testing and design verification procedures is to ensure that the default values in the configuration registers are not changed and that all registers contain only intended values. This typically involves developing test cases to simulate accesses to a device during normal operation. FIG. 1 illustrates an exemplary simulation environment 100, in which a tester 102 may include a processor 108 configured to access registers 122 of a Device Under Test (DUT) 120 as part of a test procedure.

Conventionally, test cases must be manually developed based on the Hardware Specification 110 of DUT 120. A manual test case contains a sequence of device access instructions which can include a series of read and write operations to the registers. Several, different manual test cases may be developed to encapsulate different circumstances. However, each manual test case must be run independently. Register values are verified during the test by comparing values read from the registers to expected values or values previously written to the registers.

One problem with using manual test cases lies in its deterministic nature. Register accesses by manual test cases are performed in a given sequence using the same write data every time a particular manual test case is run. However, the manual test cases may not closely simulate real operating conditions, as accesses to hardware devices during normal operation are not so deterministic. To capture the many different ways in which a hardware device can be accessed would require the development of just as many manual test cases, which may prove impractical. As a result, many design problems such as interdependencies between registers that result in erroneous register values may not be discovered.

Therefore, there is a need for a simulation environment that better simulates the accesses to a hardware device during normal operation for more effective testing and design verification.

SUMMARY OF THE INVENTION

The present invention generally provides methods and apparatus for testing a device having an accessible set of registers.

One embodiment provides a method of testing a device. The method generally includes (a) randomly selecting an entry from a set of one or more access tables, the entry including at least a read address field, a read data field, and a read data mask field, (b) performing a read access to a register of the device identified by the read address field, (c) comparing data received from the device, in response to the read access, to data in the read data field, wherein the read data mask field identifies bits in the read data field to be excluded from the comparison, and (d) repeating steps (a)-(c) to access multiple registers. For some embodiments, such randomized read operations may be followed by write operations to write data read back to the same register address. In a similar manner, for some embodiments, randomized write operations may be followed by read operations to the same register address to verify the write operations.

Another embodiment provides a computer readable medium containing a program for testing a device which, when executed by a processor, the program performs operations generally including (a) randomly selecting an entry from a set of one or more access tables, the entry including at least a write address field, a write data field, and a write data mask field, (b) generating randomized write data by randomly assigning logical values to one or more bits of data in the write data field, wherein the write data mask identifies bits in the write data field to be excluded from the random assigning of logical values, thereby preserving their original logical values, (c) performing a write access to write the randomized write data to a register of the device identified by the write address field, and (d) repeating steps (a)-(c) to write randomized data to multiple registers.

Another embodiment provides a test system generally including a device under test having a set of registers, a set of one or more access tables, and a tester. The tester is generally configured to (a) randomly select an entry from the access tables, the entry including at least a read address field, a read data field, and a read data mask field, (b) perform a read access to a register of the device identified by the read address field, (c) compare data received from the device, in response to the read access, to data in the read data field, wherein the read data mask field identifies bits in the read data field to be excluded from the comparison, and (d) repeat steps (a)-(c) to access multiple registers.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENTS

The present invention is directed to a system, method and article of manufacture for testing and design verification of hardware devices by providing for random accesses to the registers of a device under test. Such random accesses may more closely resemble actual accesses to the registers of a device during normal operation, thus providing a more thorough test.

Figure 2:
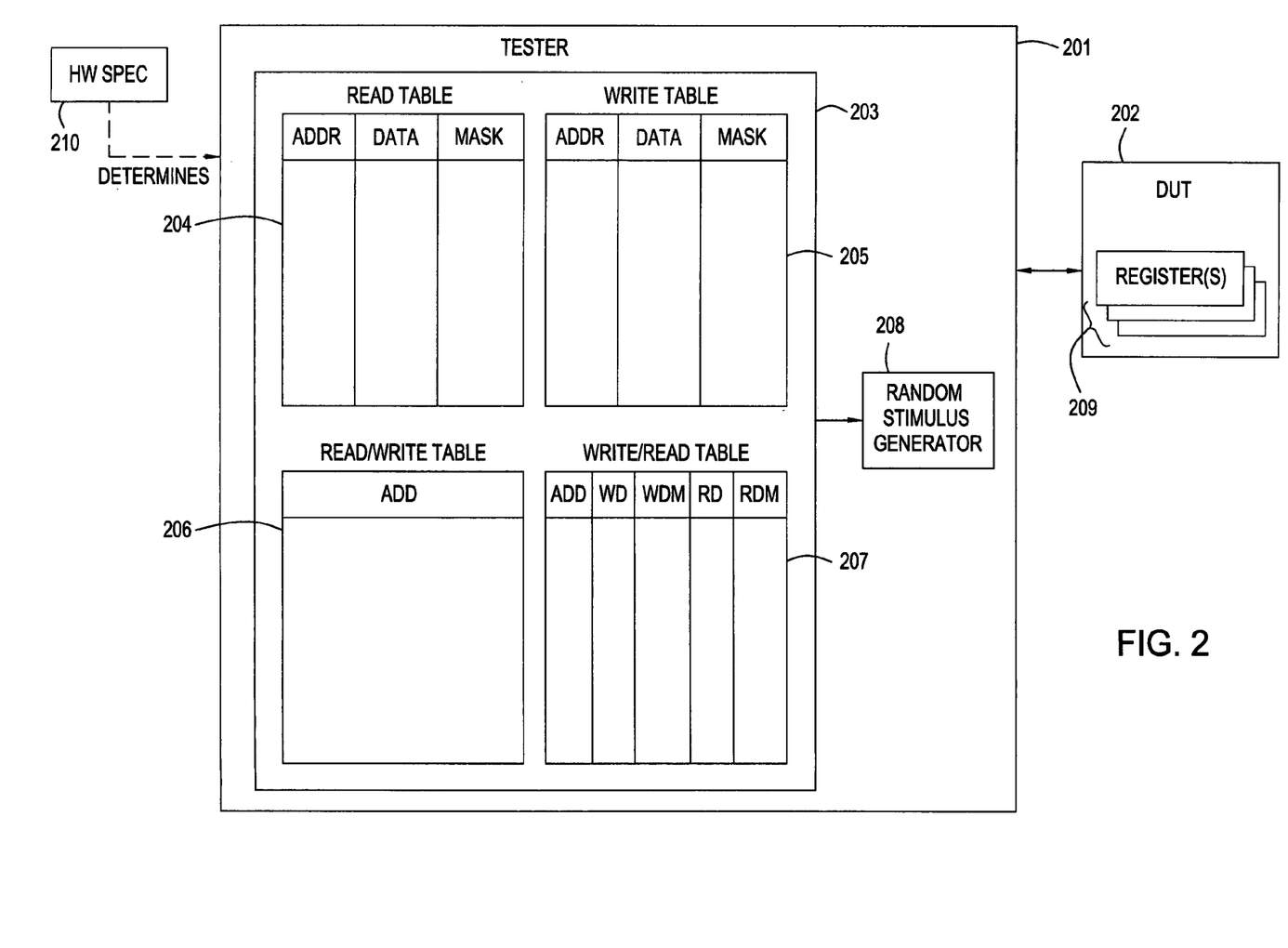
FIG. 2 illustrates an exemplary test system, in accordance with the present invention.

FIG. 2 illustrates an exemplary testing environment in which a tester 201 performs tests on a Device Under Test (DUT) 202 according to one embodiment of the invention. The tester 201 generally includes any suitable combination of hardware and test execution software configured to initiate test sequences on DUT 202. The tester 201 contains a set of tables 203. Each of the tables may represent a particular type of register access to the DUT. In one embodiment of the invention, set of tables 203 may be any combination of a Read Table 204, a Write Table 205, a Read/Write Table 206 and/or a Write/Read Table 207. The tester may also contain a Random Stimulus Generator 208 configured to randomly access registers 209 of the DUT 202 based on entries in the tables 203.

DUT 202 can be any device that includes an accessible register set 209. The DUT can include both physical hardware devices and hardware device simulators. Examples of DUT's which may be tested in accordance with techniques described herein include, but are not limited to, Central Processing Units (CPU's), Graphics Processing Units (GPU's), and any other integrated circuit containing registers. Accordingly, the tester 201 may simulate any type of device that accesses such devices during normal operation.

The set of tables 203 are populated either automatically or manually in accordance with a Hardware Specification 210. For example, the hardware specification 210 may identify an address range of accessible registers of the DUT 202 and specify bits in those registers that should be ignored during read accesses (e.g., some bits, such as status bits, may be changed by processor operation and may not be deterministically checked) or should not be changed during write accesses (e.g., configuration bits that, if changed, might adversely alter device operation). During a test procedure, the Random Stimulus Generator 208 may randomly select entries in the tables 203 and randomly access (stimulate) corresponding registers accordingly.

To test the veracity of design and to uncover unintended defects in register values, the values in the registers are monitored as the stimulus (in the form of randomized register accesses) is applied. Any suitable combination of register accesses may be generated to stimulate the DUT during one or multiple test procedures. In one embodiment of the invention, such stimulus can include read accesses, write accesses, read accesses followed by write accesses, and/or write accesses followed by a read accesses.

Figure 3:
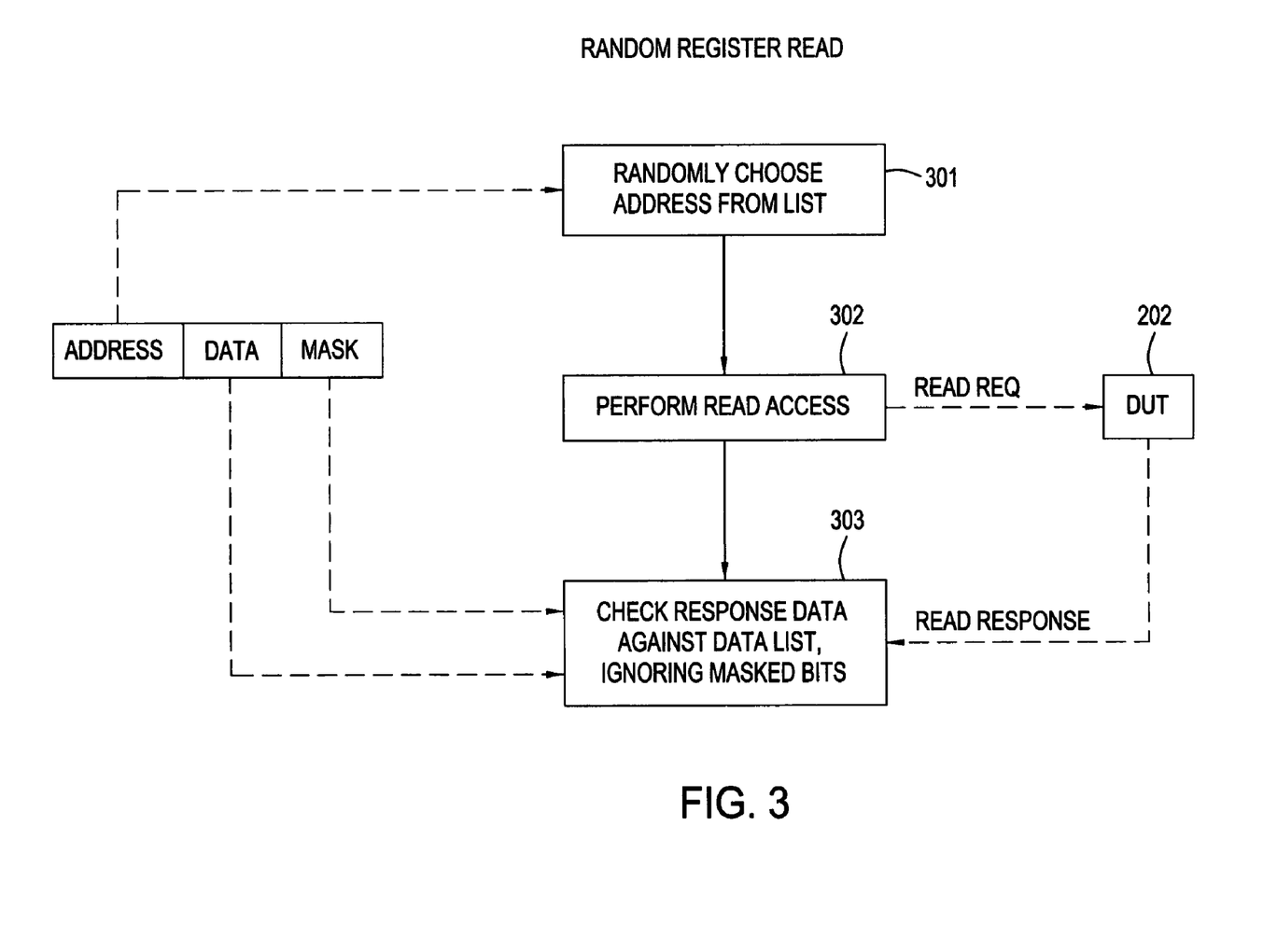
FIG. 3 illustrates an exemplary flow diagram for performing a randomized read register access, in accordance with the present invention.

Randomized read accesses may be generated by randomly accessing entries in the Read Table 204. Each entry in the Read Table 204 may contain an address field, data field, and data mask field. FIG. 3 illustrates a flow diagram of a read operation utilizing table 204. At step 301, an entry for a corresponding register address is randomly selected from Read Table 204. The address may or may not address a register in the DUT (e.g., normal traffic may include accesses to non-DUT registers). A read access to the address is then performed, at step 302, and response data (assuming a DUT address) is received from the DUT. At step 303, the data received from the DUT is compared to the data contained in the selected entry to detect errors.

As previously described, the data in the data field may include expected values contained in the corresponding DUT registers (e.g., default values). During the comparison, the data mask field is used to determine which bits of the response data must be checked, and which bits should be ignored. As an example, some bits may be read-only bits of the DUT with no corresponding default values to check. In any case, if an error is detected based on a mismatch in the bits involved in the comparison, the test may be halted immediately and/or the address, along with the expected and erroneous data may be recorded in an error log. An advantage to the present approach is that changes in expected/default values may be accounted for with simple changes in the tables 203, while still allowing randomized accesses.

Figure 4:
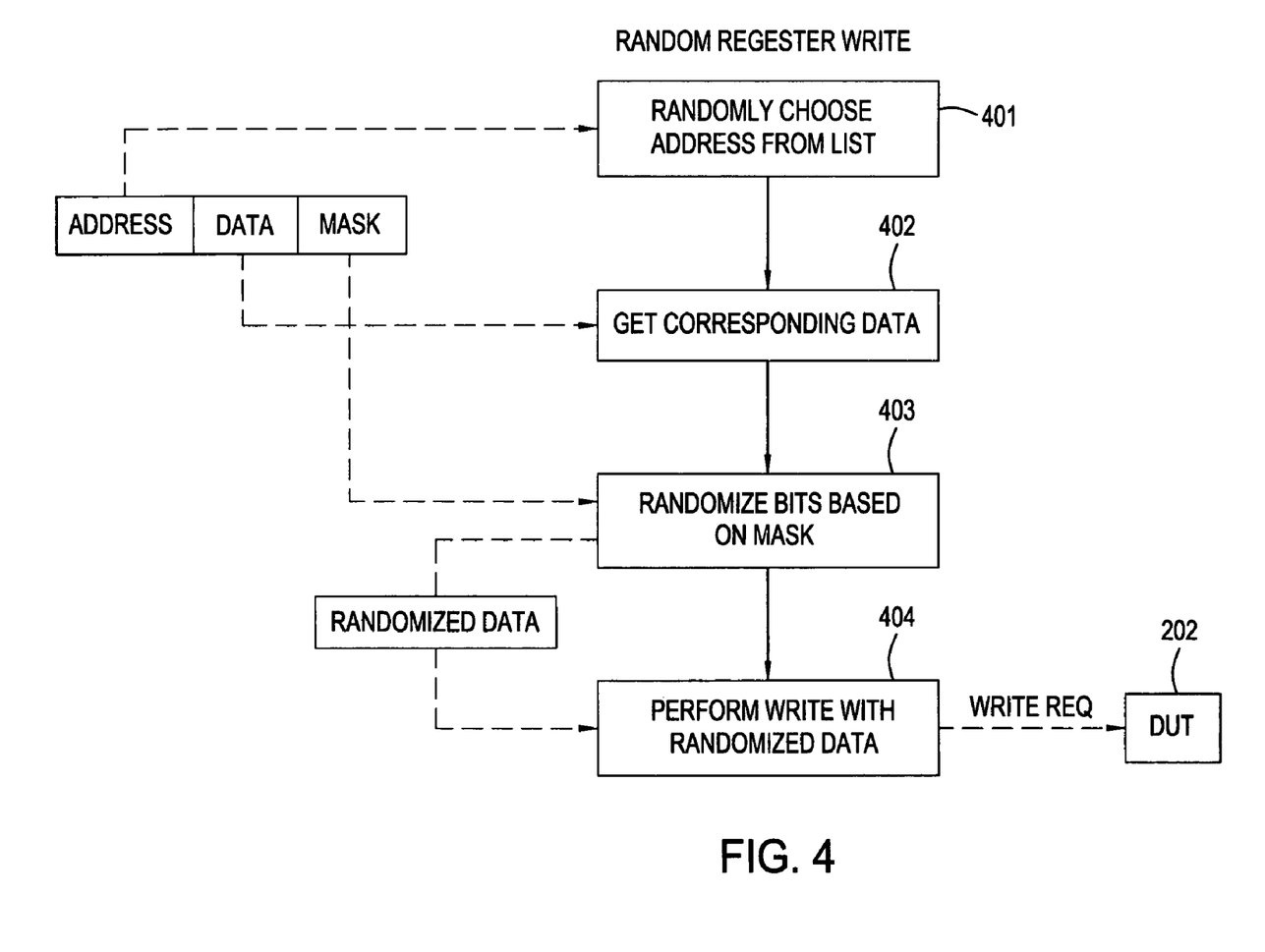
FIG. 4 illustrates an exemplary flow diagram for performing a randomized write register access, in accordance with the present invention.

Randomized write accesses may be generated by randomly accessing entries in the Write Table 205. Like the Read Table 204, entries in the Write Table 205 may also contain an address, data and a data mask. FIG. 4 illustrates a flow diagram of the write operation. At step 401, an entry is randomly selected from the Write Table 205. At step 402, the data from the data field of the selected entry is then selected. At step 403, this data is masked off using the data mask field associated for the selected entry. This masking may help ensure those bits in the corresponding register that affect device operation (i.e., configuration bits) are preserved. This may be important, for example, because any changes in the configuration bits may adversely affect device operation and may even render the device inoperable. For example, a change in the bits setting a connection speed between the hardware device and another device may cause the devices to fall out of synchronization, and unable to communicate with each other. In the final step 404, the masked data is written to the selected register in the DUT.

Figure 5:
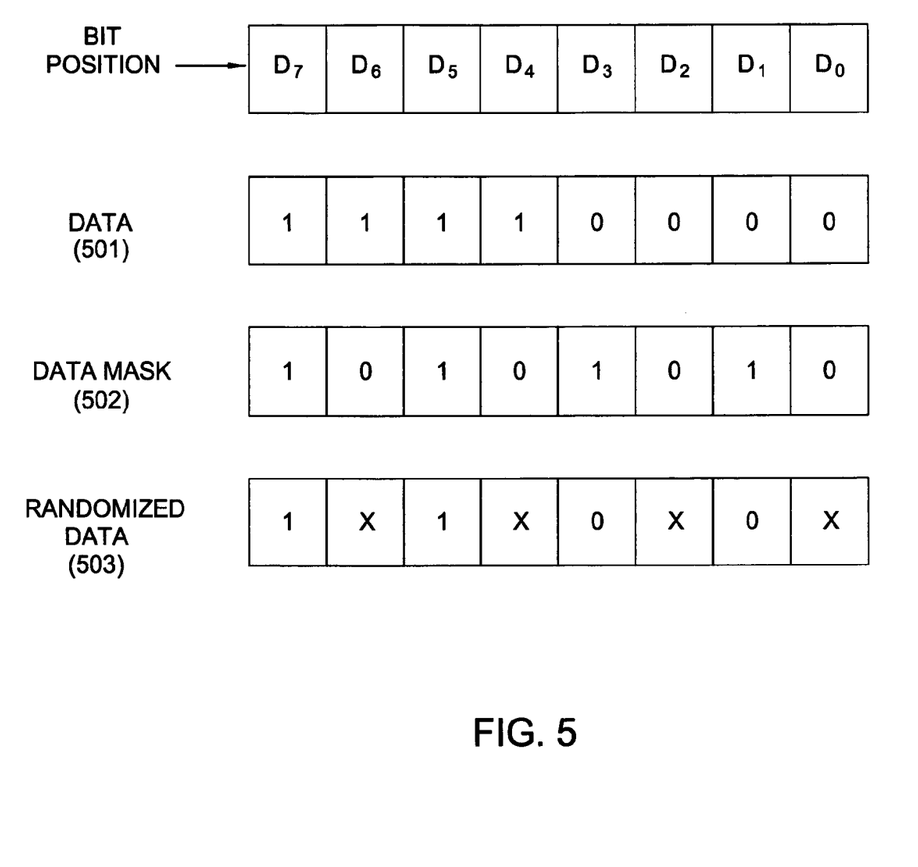
FIG. 5 illustrates an exemplary masking operation for selectively randomizing bits of write data, in accordance with the present invention.

During the write mask operation described above, those bits in the data field that are associated with bits in the data mask with a first logical value (e.g., a logical '1') may be preserved, while the remaining bits may be randomized. An example of the data masking process is illustrated in FIG. 5. Data 501 containing bits in the D0-D7 positions is masked off using data mask 502. In the data mask 502 bits in positions D1, D3, D5 and D7 are set to 1. Bits in positions D0, D2, D4 and D6 are set to 0. Therefore, after masking the Data After Masking 503, contains the same values as Data 501 in positions D1, D3, D5 and D7. Bits D0, D2, D4 and D6 of the Data After Masking, on the other hand, are randomly set to either a 1 or a 0, as denoted by an 'X' in the figure.

Figure 6:
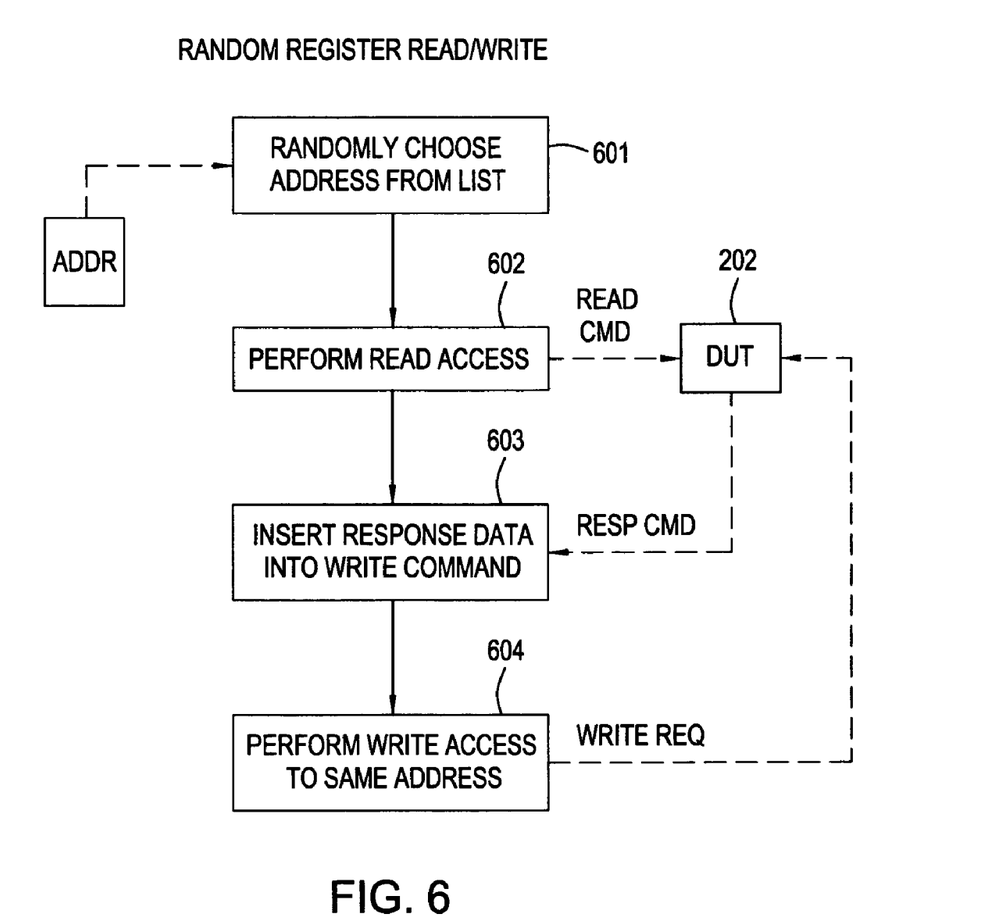
FIG. 6 illustrates an exemplary flow diagram for performing a randomized read followed by a write register access, in accordance with the present invention.

A Read/Write operation may be performed in a similar manner to the read and write operations performed sequentially. A flow diagram of the Read/Write operation is illustrated in FIG. 6. At step 601, an entry is randomly selected from the Read/Write Table 206. Unlike Read Table 204 and Write Table 205, Read/Write Table 206 may contain only an address list and no data and data mask lists. After an entry is selected in step 601, a read access to that corresponding register address is performed, at step 602, and data from that register is received. This data is then inserted into a write command, at step 603, and written back to the same register (from which it was read). The Read/Write operation may be used to create random traffic that accesses the DUT, while still preserving register data (by writing back the same data read). Such random traffic simulates real traffic that accesses the DUT during normal operation. The Read/Write operation may also serve to address registers that are infrequently accessed during normal operation, due to the random selection of table entries with different corresponding register addresses.

Figure 7:
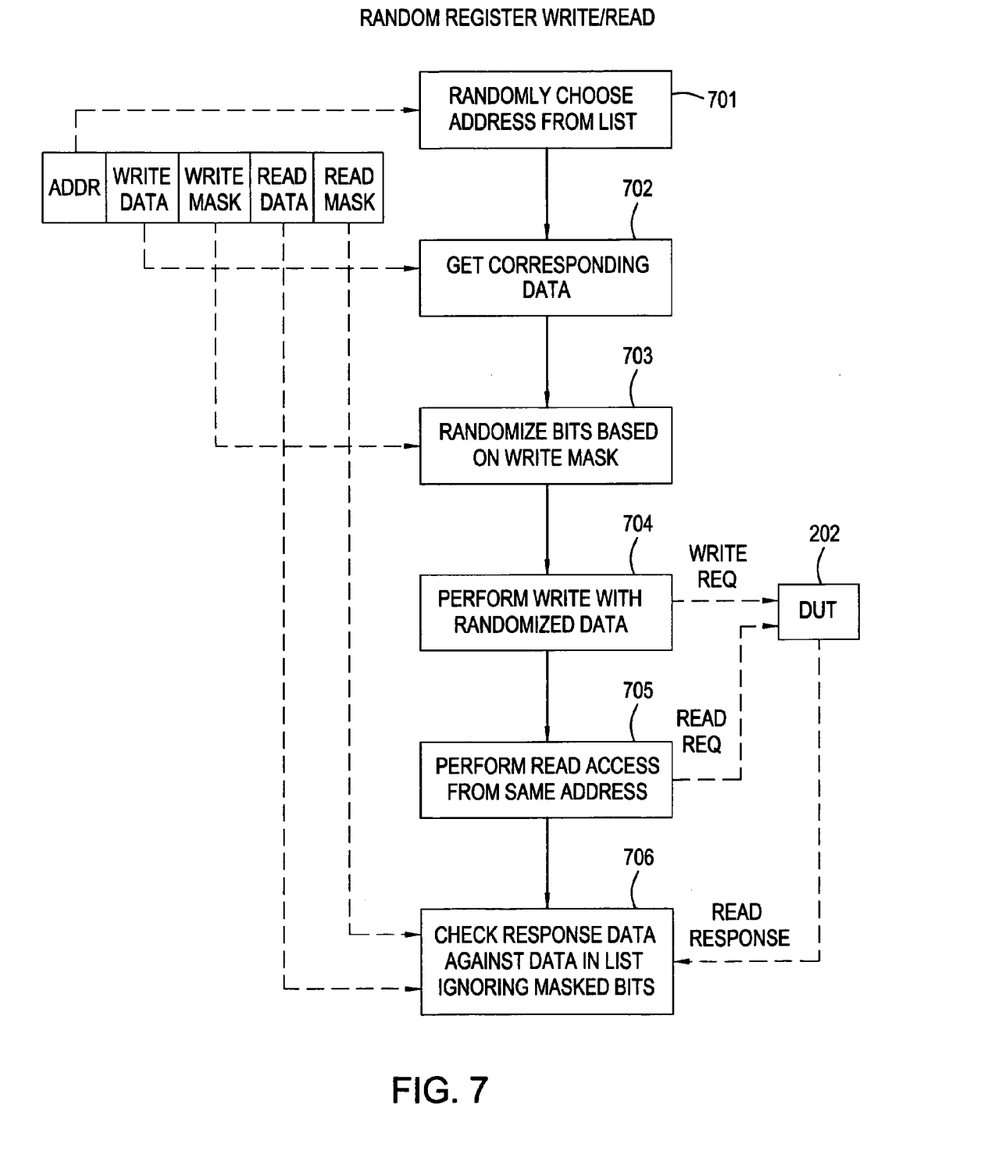
FIG. 7 illustrates an exemplary flow diagram for performing a randomized write followed by a read register access, in accordance with the present invention.

A Write/Read operation may be performed in a similar manner to the write and read operations performed sequentially, using the Write/Read Table 207. Table 207 contains lists of addresses, write data, write data masks, read data and read data masks. A flow diagram of the Write/Read operation is illustrated in FIG. 7. During a Write/Read operation, an entry is randomly selected from Table 207, at step 701. Write data corresponding to the address is then selected, at step 702. This data is masked off, at step 703, using the corresponding write data mask. The masked data is then written to the selected register address, at step 704. After the write has been performed, at step 705, a read access to the same register address is performed.

At step 706, data received in response to the read access is compared to the data in the read data field of the table to identify any discrepancies between the data read and the data in the read data field. As described before, the read data mask may be used to determine which bits should be ignored during the comparison. The benefit of such Write/Read operations is that they may be used to validate write operations by confirming the data written is indeed the data that is read back.

While it is desirable to perform random accesses to the DUT, there may also be some instances where it is desirable to perform non-random, sequential accesses. In one embodiment of the invention, the Random Stimulus Generator may be set to perform such non-random sequential accesses. For example, at the end of one phase of testing where random selection from the tables is made, the Random Stimulus Generator may then be set to perform a sequence of reads on all the registers in the DUT to retrieve the data contained in them. This batch of data may then be checked for errors in the registers that resulted from the initial test. Sequential accesses may not access all registers in the DUT, but only those specified in a given table, which could be a subset of all DUT registers. Further, entries in the table may be arranged in a manner to produce different sequential access combinations.

The randomized register accesses described above may be combined in any manner to generate a suitable test, for example, with the duration of the test and total number of randomized accesses selected to ensure an adequate "test coverage." While some embodiments have been described with specific reference to IC devices, such as CPUs and GPUs, those skilled in the art will recognize that any type of device with accessible registers may be advantageously tested utilizing the techniques described herein.

CONCLUSION

By generating randomized accesses to registers of a device under test, test procedures may be created that more realistically simulate register traffic during operating conditions. Due to the randomization, different types of accesses to different register addresses may be generated from a standard set of access tables. As a result, more thorough tests may be performed with less up front time than conventionally required using manual test cases.

While the foregoing is directed to embodiments of the present invention, other and further embodiments of the invention may be devised without departing from the basic scope thereof, and the scope thereof is determined by the claims that follow.

What is claimed is:

1. A method of testing a device, comprising:
   (a) randomly selecting a first entry from a plurality of entries from a set of one or more access tables, the entry including at least an address field, a read data field, a read data mask field, a write data field, and a write data mask field, wherein the access table from which the first entry was selected indicates an order in which a write access and a read access are to be performed relative to each other, wherein a read data field, a read data mask field, a write data field, and a write data mask field of a respective entry each corresponds to a respective address field in the respective entry, and wherein each address field of a respective entry corresponds to a different register of the device;
   (b) generating randomized write data by randomly assigning logical values to one or more bits of data in the write data field, wherein the write data mask field identifies bits in the write data field to be excluded from the random assigning of logical values, thereby preserving original logical values at bit locations identified by the write data mask field;
   step (c): performing the write access to write the randomized write data to a first register of the device identified by the address field;
   (d) subsequently, performing the read access to the first register of the device identified by the address field;
   (e) comparing data received from the device, in response to the read access, to data in the read data field, wherein the read data mask field identifies bits in the read data field to be excluded from the comparison; and
   (f) repeating steps (a)-(e) to access multiple registers.

2. The method of claim 1, further comprising recording an error event if the comparison of step (e) indicates that the data received from the device does not match data from the read data field.

3. The method of claim 1, wherein data in the read data field corresponds to an expected default value of the corresponding device register identified by the address field.

4. The method of claim 3, wherein bits in the read mask field correspond to bits of the device register identified by the address field that are non-deterministic.

5. The method of claim 1, further comprising:
   (g) randomly selecting a second entry from the set of one or more access tables, the second entry including at least a write address field, a write data field, and a write data mask field;
   (h) generating randomized write data by randomly assigning logical values to one or more bits of data in the write data field, wherein the write data mask field identifies bits in the write data field to be excluded from the random assigning of logical values, thereby preserving original logical values at bit locations identified by the write data mask field; and (i) performing a write access to write the randomized write data to a second register of the device identified by the write address field.

6. The method of claim 5, wherein bits in the write mask field correspond to configuration bits in the device register identified by the write address field.

* * * * *